(12) United States Patent
Papageorgiou et al.

(10) Patent No.: US 10,615,749 B2
(45) Date of Patent: Apr. 7, 2020

(54) MODULATOR

(71) Applicant: QUALCOMM Incorporated, San Diego, CA (US)

(72) Inventors: Efthymios Philip Papageorgiou, Berkeley, CA (US); Ara Bicakci, Belmont, CA (US); Sean Joel Lyn, Cupertino, CA (US); Yue Lu, Los Gatos, CA (US); Ngar Loong Alan Chan, San Jose, CA (US)

(73) Assignee: QUALCOMM Incorporated, San Diego, CA (US)

(*) Notice: Subject to any disclaimer, the term of this patent is extended or adjusted under 35 U.S.C. 154(b) by 45 days.

(21) Appl. No.: 16/013,605

(22) Filed: Jun. 20, 2018

(65) Prior Publication Data
US 2019/0393838 A1    Dec. 26, 2019

(51) Int. Cl.
*H03C 1/54* (2006.01)
*H04L 27/36* (2006.01)
*H03F 3/217* (2006.01)

(52) U.S. Cl.
CPC ........... *H03C 1/547* (2013.01); *H03F 3/2175* (2013.01); *H04L 27/362* (2013.01)

(58) Field of Classification Search
CPC ...... H03C 1/547; H03F 3/2175; H04L 27/362
See application file for complete search history.

(56) References Cited

U.S. PATENT DOCUMENTS

| 8,385,469 B2 | 2/2013 | Wang et al. |
|---|---|---|
| 9,450,798 B2 | 9/2016 | Muhammad et al. |
| 9,490,966 B2 | 11/2016 | Winoto et al. |
| 9,559,879 B2 | 1/2017 | Deng et al. |
| 9,742,444 B1 | 8/2017 | Cha et al. |

*Primary Examiner* — Patricia T Nguyen
(74) *Attorney, Agent, or Firm* — Seyfarth Shaw LLP/QUALCOMM Incorporated

(57) ABSTRACT

A modulator may include a controller configured to receive in-phase (I) baseband signals and quadrature-phase (Q) baseband signals. The controller may be configured to select a section of a region defined by a number of local oscillator (LO) phases. The controller may be configured to output multiple control signals and a pair of phase selection signals. The modulator may further include multiple output stages. Each output stage may be coupled to the controller to receive a pair of the control signals, the pair of phase selection signals, and multiple offset LO signals. Each of the output stages may include a unit element.

21 Claims, 15 Drawing Sheets

450

| Section | Magnitude | Sign |
|---------|-----------|------|
| 1 | $|I| > |Q|$ | $I > 0, Q > 0$ |
| 2 | $|Q| > |I|$ | $I > 0, Q > 0$ |
| 3 | $|Q| > |I|$ | $I < 0, Q > 0$ |
| 4 | $|I| > |Q|$ | $I < 0, Q > 0$ |
| 5 | $|I| > |Q|$ | $I < 0, Q < 0$ |
| 6 | $|Q| > |I|$ | $I < 0, Q < 0$ |
| 7 | $|Q| > |I|$ | $I > 0, Q < 0$ |
| 8 | $|I| > |Q|$ | $I > 0, Q < 0$ |

| Section | X value | Y value | Ph_X | Ph_Y |
|---|---|---|---|---|
| 1 | $\|I\| - \|Q\|$ | $\sqrt{2}\|Q\|$ | 0° | 45° |
| 2 | $\|Q\| - \|I\|$ | $\sqrt{2}\|I\|$ | 90° | 45° |
| 3 | $\|Q\| - \|I\|$ | $\sqrt{2}\|I\|$ | 90° | 135° |
| 4 | $\|I\| - \|Q\|$ | $\sqrt{2}\|Q\|$ | 180° | 135° |
| 5 | $\|I\| - \|Q\|$ | $\sqrt{2}\|Q\|$ | 180° | 225° |
| 6 | $\|Q\| - \|I\|$ | $\sqrt{2}\|I\|$ | 270° | 225° |
| 7 | $\|Q\| - \|I\|$ | $\sqrt{2}\|I\|$ | 270° | 315° |
| 8 | $\|I\| - \|Q\|$ | $\sqrt{2}\|Q\|$ | 0° | 315° |

- Note that $X \geq 0$ and $Y \geq 0$ and $X + Y \leq N$

*FIG. 4D*

MODULATOR

TECHNICAL FIELD

The present disclosure generally relates to electronic circuits and, more particularly, to a modulator (e.g., a digital power amplifier).

BACKGROUND

Digital signals are used for transmitting information over a network. For example, the digital signals may be transmitted from a digital transmitter. In operation, the digital transmitter receives in-phase (I) and quadrature-phase (Q) input signals and processes the I and Q input signals through various processing stages, including a power amplifier stage. The processed I and Q input signals may then be transmitted as a digital signal. Various digital signal transmission techniques may be implemented for processing and transmitting digital signals.

Conventionally, a polar, a Cartesian IQ, or a four-phase IQ technique are used for digital signal transmission. The polar technique converts an input signal (I, Q) into polar coordinates prior to transmission. The Cartesian IQ technique uses the in-phase (I) and the quadrature-phase (Q) of the input signal for determining a transmission scheme within a square-shaped transmission region. The four-phase IQ technique uses a diamond-shaped transmission region along the zero-degree axis and 90-degree axis, which is a variation of the Cartesian IQ method.

Each of these conventional digital signal transmission techniques suffer from different problems. For example, a disadvantage of the polar method is that it is processing intensive, although it yields a maximum range of transmission signals within a full circle. Disadvantages of the Cartesian IQ method include inefficiency for points not along I or Q vectors. Finally, the four-phase IQ method suffers from inefficiencies in transmission not along the zero-degree axis or 90-degree axis.

It is therefore desirable to implement a modulator that overcomes these deficiencies by reducing processing intensity while also improving transmission efficiency.

SUMMARY

A modulator may include a controller configured to receive in-phase (I) baseband signals and quadrature-phase (Q) baseband signals. The controller may be configured to select a section of a region defined by a number of local oscillator (LO) phases. The controller may be configured to output multiple control signals and a pair of phase selection signals. The modulator may further include multiple output stages. Each output stage may be coupled to the controller to receive a pair of the control signals, the pair of phase selection signals, and multiple offset LO signals. Each of the output stages may include a unit element.

A digital modulation method may include receiving incoming in-phase (I) and quadrature-phase (Q) baseband signals. The method may further include selecting two of eight or more local oscillator (LO) phases based on the baseband signals. The method may further include selecting a magnitude for each selected local oscillator phase, the selected magnitudes representing the baseband signals. The method may further include generating a radio frequency (RF) signal based on the selected magnitudes and phases.

A modulator may include means for receiving in-phase (I) baseband signals and quadrature-phase (Q) baseband signals. The modulator may further include means for selecting a section of a region defined by a number of local oscillator (LO) phases. The modulator may further include means for outputting multiple control signals and a pair of phase selection signals. The modulator may further include multiple output stages. Each of the output stages may be coupled to the outputting means to receive a pair of the control signals, the pair of phase selection signals, and multiple offset LO signals. Each of the output stages may include a unit element.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 4C illustrates a table that correlates a magnitude and a sign of I and Q to one of the sections illustrated in FIG. 4A.

FIG. 4D illustrates a constellation mapping chart, according to aspects of the present disclosure.

DETAILED DESCRIPTION

Figure 1:
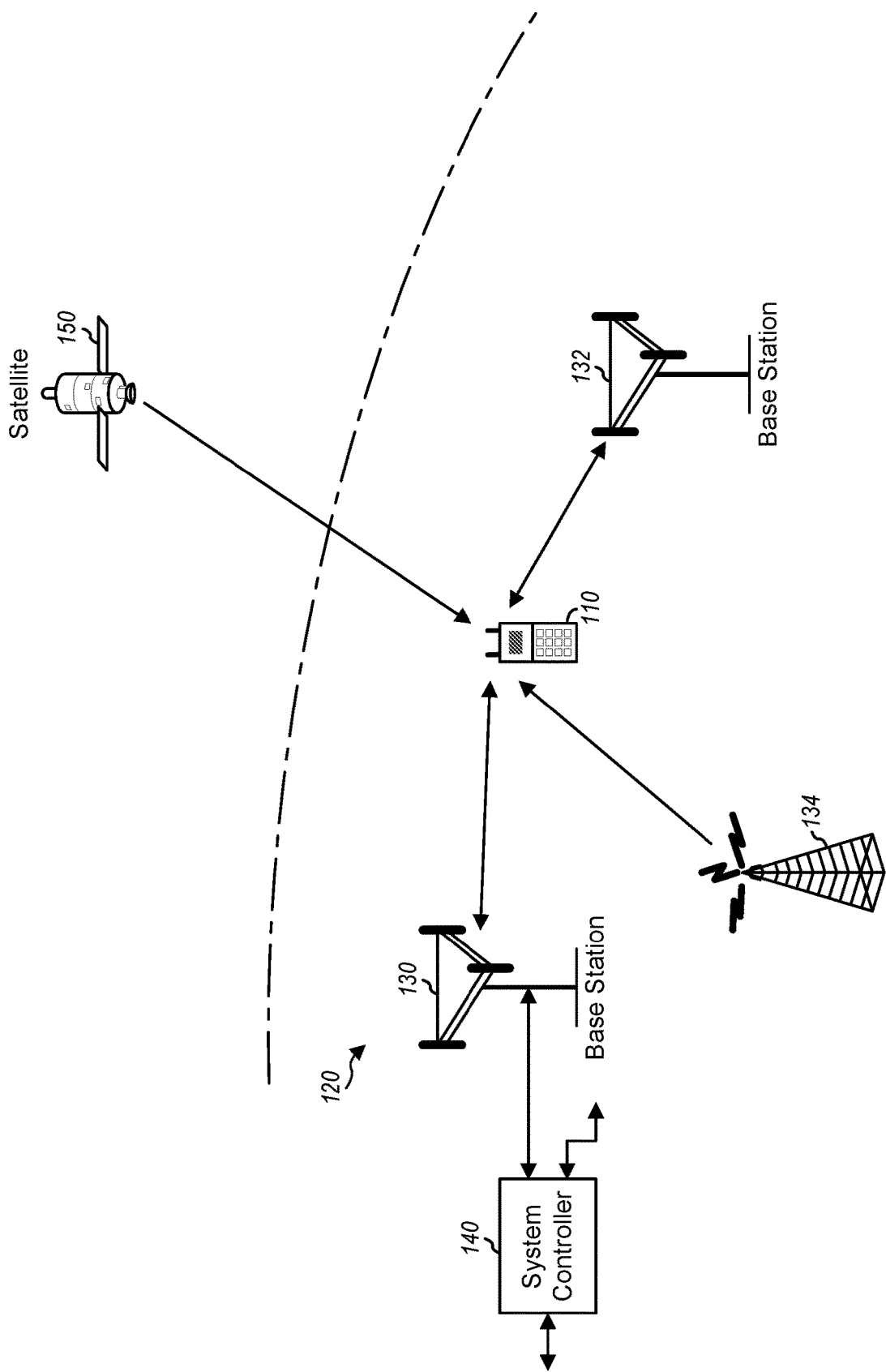
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

The techniques described herein may be used in combination with various wireless technologies such as code division multiple access (CDMA), orthogonal frequency division multiplexing (OFDM), time division multiple access (TDMA), spatial division multiple access (SDMA), SC-FDMA, time division synchronous code division multiple access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16 (WiMax), LTE (e.g., in TDD and/or FDD modes), fifth generation (5G) or some other standards. A TDMA system may implement global system for mobile communications (GSM) or some other standards. These various standards are known in the art.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

Digital signals may be transmitted from a quadrature digital transmitter. Digital transmitters provide compact die area, good efficiency, and scale well with complementary metal-oxide-semiconductor (CMOS) technology. For example, the digital transmitter may be configured to receive in-phase (I) and quadrature-phase (Q) input signals and process the I and Q input signals through various processing stages, including a power amplifier (PA) stage. The processed I and Q input signals may then be transmitted as a digital signal. Various digital signal transmission techniques may be implemented for processing and transmitting digital signals.

Conventional transmission techniques may be implemented using polar, Cartesian IQ, or four-phase IQ. A polar technique converts an input signal (I, Q) into polar coordinates prior to transmission. A disadvantage of the polar method is that it is processing intensive, although it yields a maximum range of transmission signals within a full circle. A Cartesian IQ method uses the I and Q phases of the input signal to determine a transmission scheme within a square-shaped transmission region. Disadvantages of this method include inefficiency for points not along the I or Q vectors. A four-phase IQ method uses a diamond-shaped transmission region along the zero-degree axis and 90-degree axis, but suffers from inefficiencies in transmission not along the zero-degree axis or 90-degree axis.

A quadrature digital transmitter architecture using eight or more phases has advantages over the above-mentioned techniques for wideband applications, such as WiFi, because of its ability to scale easily to higher signal bandwidth. Additionally, the quadrature digital transmitter architecture is easier to implement with less distortion. However, conventional quadrature digital transmitters demonstrate excessive parasitics at a transmission output as a result of conventional methods of combining the I and Q input signals at a power amplifier output. Therefore, there is a desire for a digital power amplifier that overcomes these deficiencies while reducing processing intensity and yielding maximum efficiency.

Aspects of the present disclosure address these deficiencies by providing for a modulator (e.g., a digital power amplifier (PA)) having a controller configured to receive baseband in-phase (I) signals and baseband quadrature-phase (Q) signals. The controller may be configured to select a section of a region defined by a number of available local oscillator (LO) phases. The controller may further be configured to output a set of control signals and a pair of phase selection signals. The power amplifier may include multiple power amplifier output stages. Each power amplifier output stage may be coupled to the controller to receive a pair of the control signals, the pair of phase selection signals, and a set of offset LO signals. Each power amplifier output stage may include a unit element.

Aspects of the present disclosure map an input signal (I, Q) to a transmission region having at least eight sections (e.g., octagon-shaped) as a result of an increased number of phases. The I and Q values are used to directly determine a transmission signal. First, it is determined which section of the constellation will be applied, based on the input signal (I, Q). Then, using a mapping table, X, Y, X phase, and Y phase values are determined. The X and Y values are then projected onto basis vectors for transmission.

Advantages of the disclosed digital power amplifier include better range of signal processing as well as higher efficiency. Additionally, digital-to-analog converters (DACs), transmit baseband filters, upconverters, and first stage power amplifiers of conventional transmitters may be replaced with the disclosed digital power amplifier, thus saving space and reducing parasitics.

FIG. 1 shows a wireless device 110 that incorporates a digital power amplifier for communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3300 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
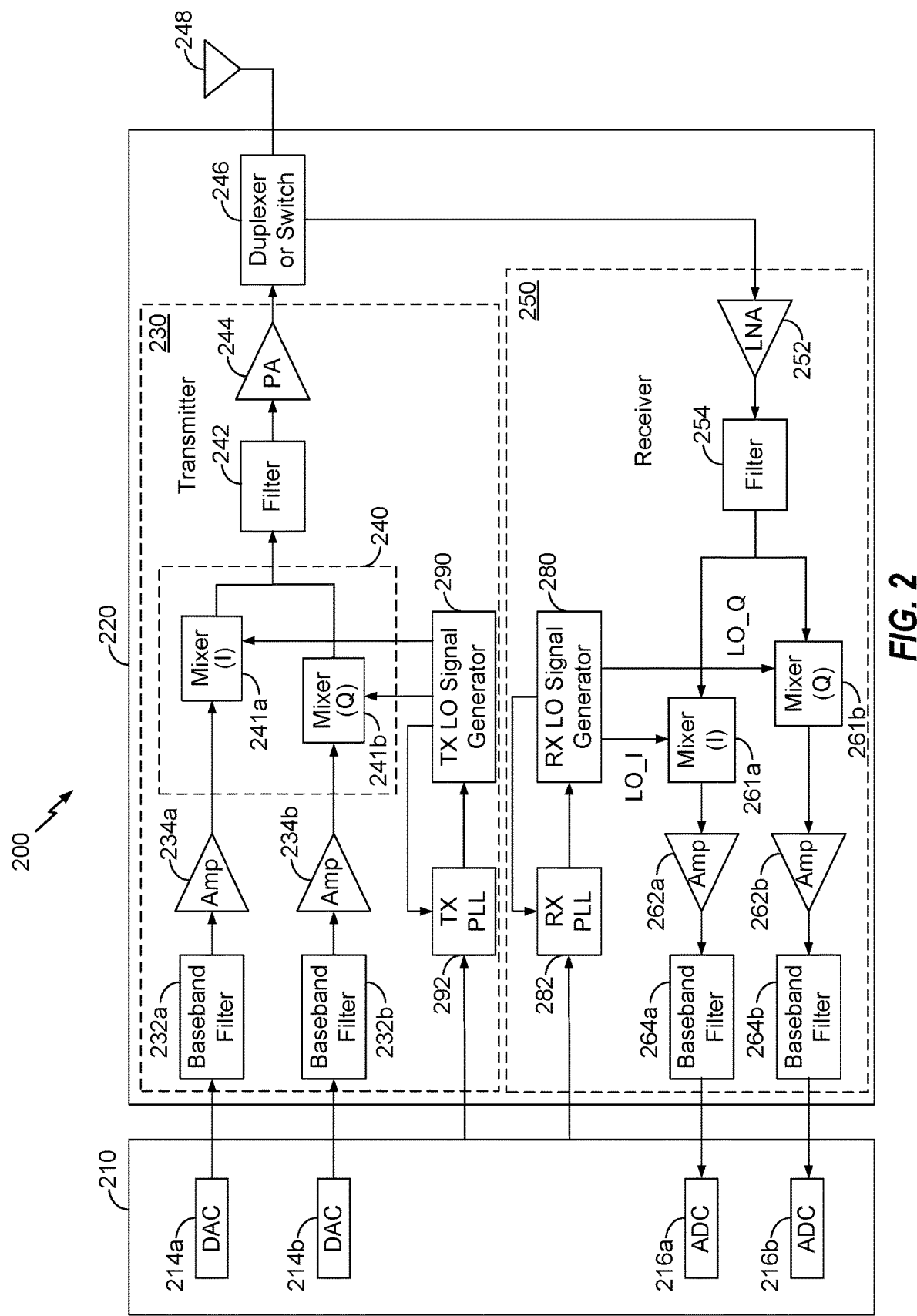
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1, which may incorporate a modulator (e.g., a digital power amplifier). FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, baseband filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from baseband filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) output stage 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by baseband filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The transmitter 230 may be a digital transmitter configured for transmitting digital signals. Digital transmitters provide compact die area, good efficiency, and scale well with complementary metal-oxide-semiconductor (CMOS) technology. For example, the digital transmitter may be configured to receive in-phase (I) and quadrature-phase (Q) input signals and process the I and Q input signals through various processing stages, including a power amplifier (PA) stage, such as the PA output stage 244. The PA output stage 244 may be appropriately modified to work in a digital transmitter system. The processed I and Q input signals may then be transmitted as a digital signal. Various digital signal transmission techniques may be implemented for processing and transmitting digital signals. For example, conventional transmission techniques may be implemented using polar, Cartesian IQ, or four-phase IQ, as shown in FIGS. 3A-3C.

Figure 3A:
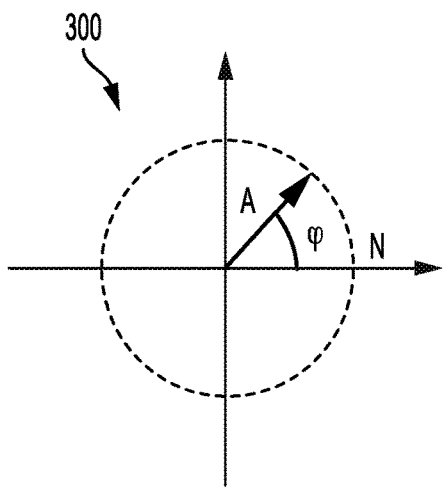
FIGS. 3A-3C illustrate conventional methods of digital signal transmission.

FIG. 3A illustrates a conventional method 300 for digital signal transmission. The conventional method 300 converts an input signal (I, Q) into polar coordinates prior to transmission. As illustrated, the conventional method 300 transmits at N, where N is a total number of unit elements and maximum allowed amplitude for a digital signal, for any given amplitude A, independent of a phase φ. A disadvantage of the polar method is that it uses computationally intensive non-linear calculations of high-bandwidth amplitude and phase signals (e.g., twice the bandwidth for amplitude, five times the bandwidth for phase). As a result, filtering is challenging.

Figure 3B:
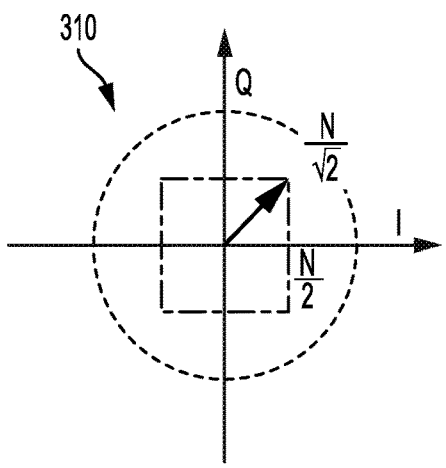

FIG. 3B illustrates a conventional Cartesian IQ method 310 for digital signal transmission. For example, the conventional Cartesian IQ method 310 has a transmission region that is square-shaped, having sides that are N (e.g., an integer value) in length. Additionally, the length of a diagonal from (0, 0) to any of the square's vertices is N/√2. The conventional Cartesian IQ method 310 generally uses the I and Q phases of an input signal for determining a transmission scheme within a square-shaped transmission region. As illustrated, the conventional Cartesian IQ method 310 uses in-phase (I) and quadrature-phase (Q) directly. As a result, the calculations are linear and there is no bandwidth expansion. Disadvantages of this method include inefficiency for points not along the I or Q vectors. As a result, reduced peak power (e.g., by at least 3 dB) and reduced efficiency are exhibited when not transmitting along the I or Q axis.

Figure 3C:
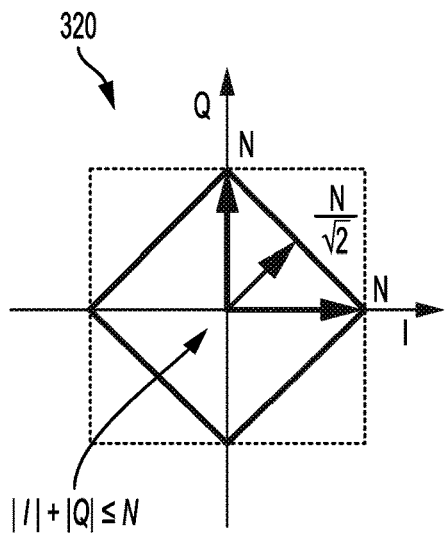

FIG. 3C illustrates a conventional diamond method 320 for digital signal transmission. The conventional diamond method is also known as a four-phase IQ method that uses a diamond-shaped transmission region along the zero-degree axis and 90-degree axis. As illustrated, the conventional diamond method 320 exhibits the same peak power as the polar method along the I and Q axes. However, along a 45-degree axis the peak power is reduced (e.g., by at least 3 dB) due to clipping of the signal. As illustrated, rather than extending past the diamond to a value of N, it is clipped to a value of N/√2. As a result, the diamond method is not as efficient as the polar method. That is, the conventional diamond method 320 suffers from inefficiencies in transmission not along the zero-degree or 90-degree axis.

A quadrature digital transmitter architecture using eight or more phases has advantages over the above-mentioned techniques (FIGS. 3A-3C) for wideband applications, such as WiFi, because of its ability to scale easily to higher signal bandwidth. Additionally, the quadrature digital transmitter architecture is easier to implement with less distortion. Nevertheless, conventional quadrature digital transmitters demonstrate excessive parasitics at a transmission output as a result of conventional methods of combining the I and Q input signals at a power amplifier output. Therefore, there is a desire for a digital power amplifier that overcomes these deficiencies while reducing processing intensity and yielding maximum efficiency.

Aspects of the present disclosure address these deficiencies by providing for a modulator (e.g., a digital power amplifier (PA)) having a controller configured to receive baseband in-phase (I) signals and baseband quadrature-phase (Q) signals. The controller may be configured to select a section of a region defined by a number of available local oscillator (LO) phases. The controller may further be configured to output control signals and a pair of selected phases. The power amplifier may include multiple power amplifier output stages. Each power amplifier output stage may be coupled to the controller to receive a pair of the control signals, the pair of selected phases, and a set of offset LO signals. Each power amplifier output stage may include a unit element.

Advantages of the disclosed modulator (e.g., digital power amplifier) include area savings in a transmitter. For example, a digital-to-analog converter (DAC), a transmit baseband filter, an upconverter, and/or first stage power amplifiers of the transmitter may be replaced with an area-efficient digital power amplifier. The digital power amplifier may also exhibit higher efficiency than the conventional methods described above.

Figure 4A:
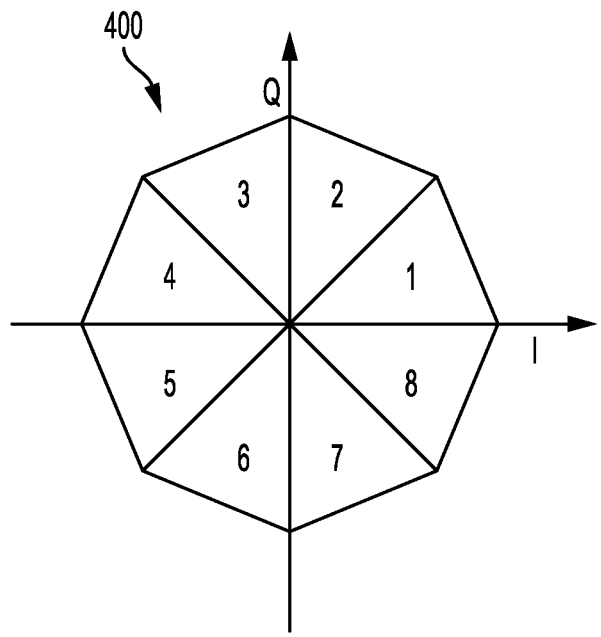
FIG. 4A illustrates a constellation mapping diagram for a modulator (e.g., a digital power amplifier), according to aspects of the present disclosure.

FIG. 4A illustrates a mapping diagram 400 (e.g., a constellation mapping diagram) for an eight-phase modulator (e.g., digital power amplifier), according to aspects of the present disclosure. For example, the mapping diagram 400 may be defined along in-phase (I) and quadrature-phase (Q) axes.

The mapping diagram 400 may include eight sections, labelled one through eight. Section one may be defined as a triangular area between zero degrees and 45 degrees. Section two may be defined as a triangular area between 45 degrees and 90 degrees. Section three may be defined as a triangular area between 90 degrees and 135 degrees. Section four may be defined as a triangular area between 135 degrees and 180 degrees. Section five may be defined as a triangular area between 180 degrees and 225 degrees. Section six may be defined as a triangular area between 225 degrees and 270 degrees. Section seven may be defined as a triangular area between 270 degrees and 315 degrees. Section eight may be defined as a triangular area between 315 and 360 degrees.

Together, all eight sections of the mapping diagram 400 may substantially form an octagonal shape. According to aspects of the present disclosure, when a transmit signal, which may be designated as (I, Q), lies along a section boundary, the transmit signal may be assigned to either of the adjoining sections of the mapping diagram 400.

According to aspects of the present disclosure, additional phases (e.g., 16, 32, 64, etc.) may be implemented. For example, for a 16-phase implementation, the constellation mapping diagram may have 16 sides, and for a 32-phase implementation, the constellation mapping diagram may have 32 sides. Additional error vector magnitude (EVM) and/or efficiency benefits may be achieved each time the number of phases is doubled. As the number of phases approaches a limit, the constellation will appear to be a circle, as in the polar method described above.

As illustrated, peak power for a transmit signal according to the mapping diagram 400 may be along the I and Q axes, as well as the 45-degree and 135-degree axes. Advantages of this method include linear calculations for determining the magnitude of each phase for transmission of the transmit signal, and thus no bandwidth expansion occurs. In addition, higher efficiency, and improved EVM as well as mask performance are achieved for the peak power transmit signal due to less frequent signal clipping, for example, as shown in FIG. 4B.

Figure 4B:
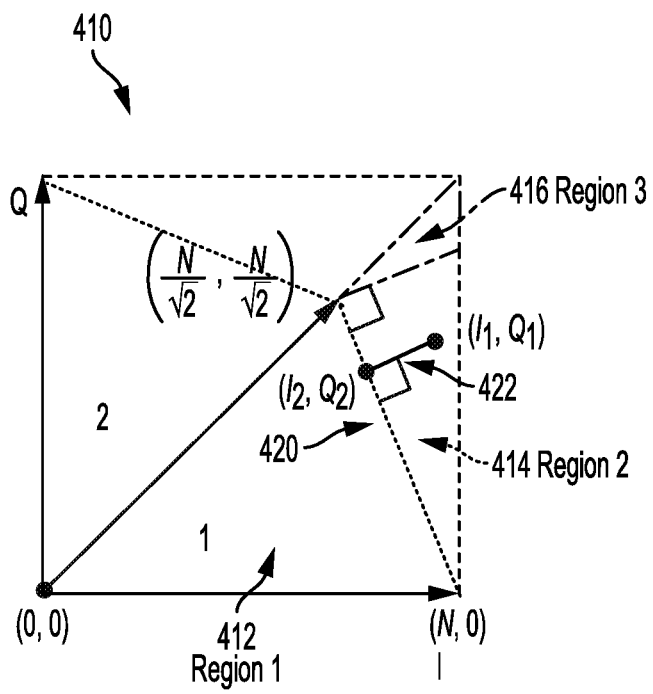
FIG. 4B illustrates a diagram of a clipping region of a constellation area, according to aspects of the present disclosure.

FIG. 4B illustrates a diagram of a clipping region 410 of a constellation area, according to aspects of the present disclosure. The clipping region 410 may include three regions (e.g., 412-416). When a data signal (I, Q) lies within a first region 412, no clipping of the transmit signal (I, Q) occurs. In this example, clipping of the transmit signal (I, Q) is unnecessary because the first region 412 is within an octagonal area of the mapping diagram 400.

By contrast, clipping occurs when a transmit signal ($I_1$, $Q_1$) lies outside of the mapping diagram 400, at either a second region 414 or a third region 416. For example, a boundary line 420 may be defined by Equation (1):

$$Q = \frac{1}{\sqrt{2} - 1}(N - I), \quad (1)$$

where N is a number of unit elements.

According to an aspect of the present disclosure, clipping may be performed by defining a shortest distance between the transmit signal ($I_1$, $Q_1$) and the boundary line 420. For example, a perpendicular line 422 may define the shortest distance between the transmit signal ($I_1$, $Q_1$) and the boundary line 420. In this example, a point ($I_2$, $Q_2$) may be defined as the point on the boundary line 420 where the perpendicular line 422 intersects the boundary line 420. As such, the perpendicular line 422 may be defined by Equation (2):

$$Q = (\sqrt{2} - 1)(I - k), \quad (2)$$

where k is the intercept of the boundary line 420 along the I-axis. For example, for any given point ($I_1$, $Q_1$), k may be found as:

$$k = \frac{-Q_1}{\sqrt{2} - 1} + I_1. \quad (3)$$

Setting the two line equations equal at the point ($I_2$, $Q_2$) yields:

$$I_2 = \frac{N + (\sqrt{2} - 1)^2 k}{1 + (\sqrt{2} - 1)^2}, Q_2 = \frac{(N - I_2)}{\sqrt{2} - 1}. \quad (4)$$

In this way, the transmit signal ($I_1$, $Q_1$) may be clipped onto the point ($I_2$, $Q_2$) (e.g., a clipped I baseband signal and a clipped Q baseband signal). For a transmit signal in the third region 416, no realizable point on the boundary line 420 is found using the preceding $I_2$ and $Q_2$ equations (1)-(4). Therefore, for this case, transmit signal ($I_2$, $Q_2$) may be represented as:

$$I_2 = \frac{N}{\sqrt{2}}, Q_2 = \frac{N}{\sqrt{2}}. \quad (4)$$

In other words, the transmit signal ($I_1$, $Q_1$) would be clipped onto point ($N/\sqrt{2}$, $N/\sqrt{2}$). It is noted that although section one is illustrated, the above clipping technique also applies to all the other sections as well. For example, the above clipping technique may be adapted to the other sections by swapping I and Q and sign flipping.

FIG. 4C illustrates a table 450 that correlates a magnitude and a sign of I and Q to one of the eight sections illustrated in FIG. 4A. For example, I>0, Q>0, and |I|>|Q| correlates to section 1, I>0, Q>0, and |Q|>|I| correlates to section 2, etc.

FIG. 4D illustrates a mapping chart 460 (e.g., constellation mapping chart), according to aspects of the present disclosure. As illustrated, the mapping chart 460 maps each section of the mapping diagram 400 to an X value and a Y value (e.g., control signals), and Ph_X and Ph_Y (e.g., phase selection signals). X and Y may each be greater than or equal to zero, and a sum of X and Y may be less than or equal to N, where N is a number of unit elements of a transmitter, as will be described in more detail below. A total quantity of the control signals is less than or equal to a quantity of unit elements. According to aspects of the present disclosure, the mapping chart 460 may implement transmitting of a signal using a modulator (e.g., a digital power amplifier), as described in more detail below.

Aspects of the present disclosure map an input signal (I, Q) to a transmission region having at least eight sections (e.g., octagon-shaped) as a result of an increased number of phases. The I and Q values directly determine a transmission signal according to the following mapping process.

First, it is determined which section of a constellation (e.g., a region) is applied, based on the input signal (I, Q). If the magnitude of I is greater than the magnitude of Q, sections 1, 4, 5, or 8 may be chosen. If the magnitude of Q is greater than the magnitude of I, sections 2, 3, 6, or 7 may be chosen. If the magnitude of I and Q are equal, either section may be chosen. For example, if I and Q are positive, section 1 or 2 is selected depending of the magnitudes of I and Q. If I has a negative value and Q has a positive value, then sections 3 or 4 are selected depending of the magnitudes of I and Q. If I has a negative value and Q has a negative value, then section 5 or 6 is selected depending of the magnitudes of I and Q. Finally, if I has a positive value and Q has a negative value, the section 7 or 8 is selected depending of the magnitudes of I and Q.

After the section of the constellation is determined, an X value, a Y value, an X phase, and a Y phase are looked up in the mapping chart 460. That is, based on the row of the mapping chart corresponding to the selected constellation section, the X and Y values are calculated based on the actual I and Q values. For example, assuming section 1 is selected, the X value=|I|−|Q|. The phases are directly looked up in the mapping chart 460. In this example, the X phase is 0 degrees. The X and Y values are then projected onto basis vectors for transmission. As another example, if $$(I, Q) = \left(1, \frac{1}{\sqrt{2}}\right),$$

then $$X = 1 - \frac{1}{\sqrt{2}},$$

and Y=1. The basis vector would then be $$\begin{bmatrix} 1 - 1/\sqrt{2} \\ 1 \end{bmatrix}, \text{ or } \begin{bmatrix} 1 \\ 1/\sqrt{2} \end{bmatrix}.$$

Advantages of this mapping process include better range of signal processing as well as higher efficiency. Additionally, digital-to-analog converters (DACs), transmit baseband filters, upconverters, and first stage power amplifiers of conventional transmitters may be replaced with the disclosed digital power amplifier, thus saving space.

Figure 5A:
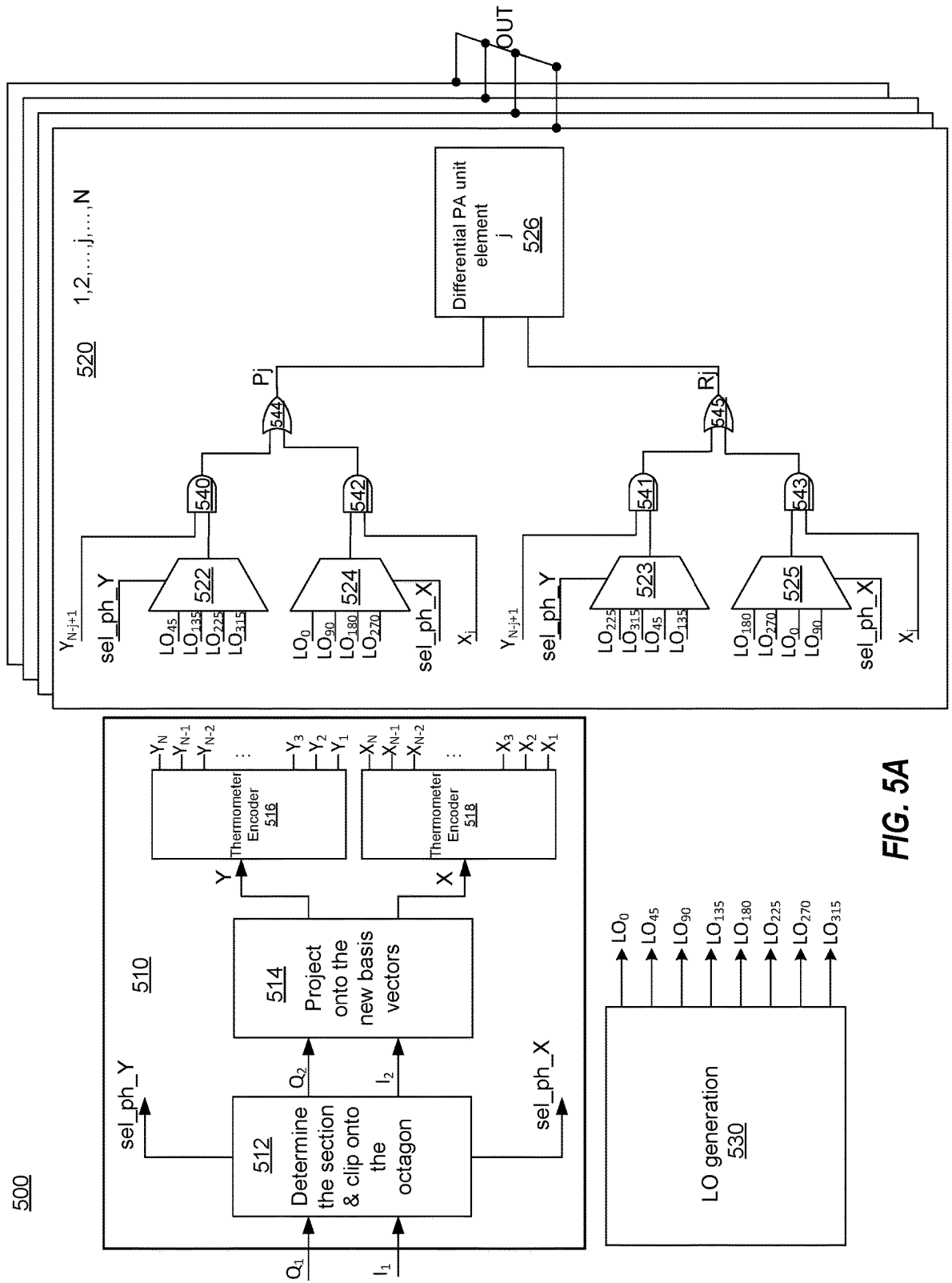
FIG. 5A illustrates a modulator (e.g., a digital power amplifier), according to aspects of the present disclosure.

FIG. 5A illustrates a modulator (e.g., a digital power amplifier 500), according to aspects of the present disclosure. The digital power amplifier 500 may include a controller 510 coupled to an output stage 520 (e.g., multiple output stages). A local oscillator (LO) 530 (e.g., phase generator) may be coupled to the output stage 520.

The controller 510 may include a first processor 512 coupled to a second processor 514. The second processor 514 may be coupled to a first thermometer encoder 516 and a second thermometer encoder 518. The controller 510 may be configured for receiving input signals $I_1$ and $Q_1$ corresponding to a transmit signal ($I_1$, $Q_1$). The input signals $I_1$ and $Q_1$ may be input into the first processor 512. For example, the first processor 512 may be configured for determining which section of the mapping diagram 400 (FIG. 4A) the input signal is within. The first processor 512 may also be configured for performing clipping, as described above.

According to an aspect of the present disclosure, the first processor 512 may be configured to output a sel_ph_Y signal, a sel_ph_X signal, an $I_2$ signal, and a $Q_2$ signal. For example, the first processor 512 may use the mapping chart 460 of FIG. 4D based on inputs signals $I_1$ and $Q_1$ for determining what values of the $I_2$ signal and the $Q_2$ signal to output. According to an aspect of the present disclosure, $I_2$ and $Q_2$ are only different from $I_1$ and $Q_1$ if clipping is used. The $I_2$ signal and the $Q_2$ signal may be input into the second processor 514. The second processor 514 may be configured for projecting the $I_2$ signal and the $Q_2$ signal onto two basis vectors (e.g., new vectors). For example, the second processor 514 may use the mapping chart 460 for determining the X and Y values for the new basis vectors. According to an aspect of the present disclosure, the second processor 514 outputs the Y value to the first thermometer encoder 516 and outputs the X value to the second thermometer encoder 518. The first thermometer encoder 516 and the second thermometer encoder 518 may be configured for thermometer encoding (e.g., unary encoding) the X value and the Y value, respectively, into a thermometer code.

According to aspects of the present disclosure, the thermometer code (e.g., a unary code) represents a natural number, n, with n ones followed by a zero (e.g., for non-negative integers) or with n−1 ones followed by a zero (e.g., for strictly positive integers). For example, a 5 may be represented as 111110 or 11110. Some representations use n or n−1 zeros followed by a one. The ones and zeros may be interchangeable without loss of generality.

The output stage 520 includes a first multiplexer (MUX) 522 and a second multiplexer 524. The output stage 520 may further include a third multiplexer 523 and a fourth multiplexer 525. The first multiplexer 522, the second multiplexer 524, third multiplexer 523, and the fourth multiplexer 525 may each be configured to receive multiple signals from the LO 530. For example, the LO 530 may be configured to generate multiple signals having the same frequency, but each having a different phase.

According to an aspect of the present disclosure, the LO 530 may generate signals of $LO_0$, $LO_{45}$, $LO_{90}$, $LO_{135}$, $LO_{180}$, $LO_{225}$, $LO_{270}$, and $LO_{315}$. For example, the signals may be phase shifted 45 degrees relative to each other. Additional details of the LO 530 and the LO signals are described below in relation to FIG. 5B.

According to an aspect of the present disclosure, the first multiplexer 522 may be configured to receive the $LO_{45}$, $LO_{135}$, $LO_{225}$, and $LO_{315}$ signals, and the second multiplexer 524 may be configured to receive the $LO_0$, $LO_{90}$, $LO_{180}$, and $LO_{270}$ signals. The third multiplexer 523 may be configured to receive the $LO_{225}$, $LO_{315}$, $LO_{45}$, and $LO_{135}$, signals, and the fourth multiplexer 525 may be configured to receive the $LO_{180}$, $LO_{270}$, $LO_0$, and $LO_{90}$, signals. According to an aspect of the present disclosure, the first multiplexer 522 and the third multiplexer 523 may be configured to receive the sel_ph_Y signal from the first processor 512, and the second multiplexer 524 and the fourth multiplexer 525 may be configured to receive the sel_ph_X signal from the first processor 512. The first multiplexer 522 and the third multiplexer 523 may be configured to select an LO signal based on the received sel_ph_Y signal. The second multiplexer 524 and the fourth multiplexer 525 may be configured to select an LO signal based on the received sel_ph_X signal.

The X and Y vectors may be determined from FIG. 4A. For example at zero degrees, the X vector is 1 and the Y vector is zero, at 45 degrees both X and Y vectors are $$\frac{1}{\sqrt{2}},$$

at 90 degrees the X vector is zero and the Y vector is 1. At 135 degrees the X vector is $$-\frac{1}{\sqrt{2}}$$

and the Y vector is $$\frac{1}{\sqrt{2}},$$

etc.

According to aspects of the present disclosure, the output stage 520 may be configured to receive a thermometer encoded Y signal, $Y_{N-j+1}$, and a thermometer encoded X signal, $X_j$, where N is a total number of unit elements, and j is an integer between 1 and N, inclusive, that denotes to which unit element the signals are passed. The signal $Y_{N-j}+1$ may be combined with an output of the first multiplexer 522 at a first gate 540, and the signal $X_j$ may be combined with an output of the second multiplexer 524 at a second gate 542. Outputs of the first gate 540 and the second gate 542 may be combined at a third gate 544. An output of the third gate 544 (e.g., $P_j$) may be input into one of the power amplifier (PA) unit elements 526.

Similarly, the signal $Y_{N-j+1}$ may be combined with an output of the third multiplexer 523 at a fourth gate 541, and the signal $X_j$ may be combined with an output of the fourth multiplexer 525 at a fifth gate 543. Outputs of the fourth gate 541 and the fifth gate 543 may be combined at a sixth gate 545. An output of the sixth gate 545 (e.g., $R_j$) may be input into one of the power amplifier (PA) unit elements 526.

According to an aspect of the present disclosure, the output stage 520 may include multiple output stages. For example, there may be N output stages numbered 1, 2, ..., j, ..., N. Each output stage receives one pair of the thermometer encoded X and Y signals (e.g., $Y_1, \ldots, Y_N$, and $X_1, \ldots, X_N$). Multiple multiplexers may be shared by the output stages, rather than having each output stage include its own multiplexers. For example, the first multiplexer 522 and the second multiplexer 524 may be shared by all of the power amplifier (PA) unit elements 526. According to an aspect of the present disclosure, a magnitude of X will determine how many of the unit elements are used to generate the X vector and a magnitude of Y will determine how many of the unit elements are used to generate the Y vector. The combination of the X vector and Y vector produces the desired $(I_1, Q_1)$ constellation point.

According to aspects of the present disclosure:

$$|I_1| \leq N, |Q_1| \leq N, |I_2| \leq N, |Q_2| \leq N, \quad (5)$$

where $I_1$ and $Q_1$ are input signals, $I_2$ and $Q_2$ are determined from the mapping chart 460, and N is a number of unit elements.

According to additional aspects of the present disclosure:

$$0 \leq X \leq N, 0 \leq Y \leq N, X+Y \leq N, X_i \in \{0,1\}, Y_i \in \{0,1\} \text{ for}$$
$$i=1, \ldots, N. \quad (6)$$

As described and illustrated, the output stage 520 may be implemented in a single-ended or differential configuration. In the single-ended configuration, only the first multiplexer 522, the second multiplexer 524, the first gate, 540, the second gate 542, and the third gate 544 of the output stage 520 are utilized. In the differential configuration, the third multiplexer 523, the fourth multiplexer 525, the fourth gate 541, the fifth gate 543, and the sixth gate 545 of the output stage 520 are utilized in addition to the multiplexers and the gates of the single-ended configuration.

Figure 5B:
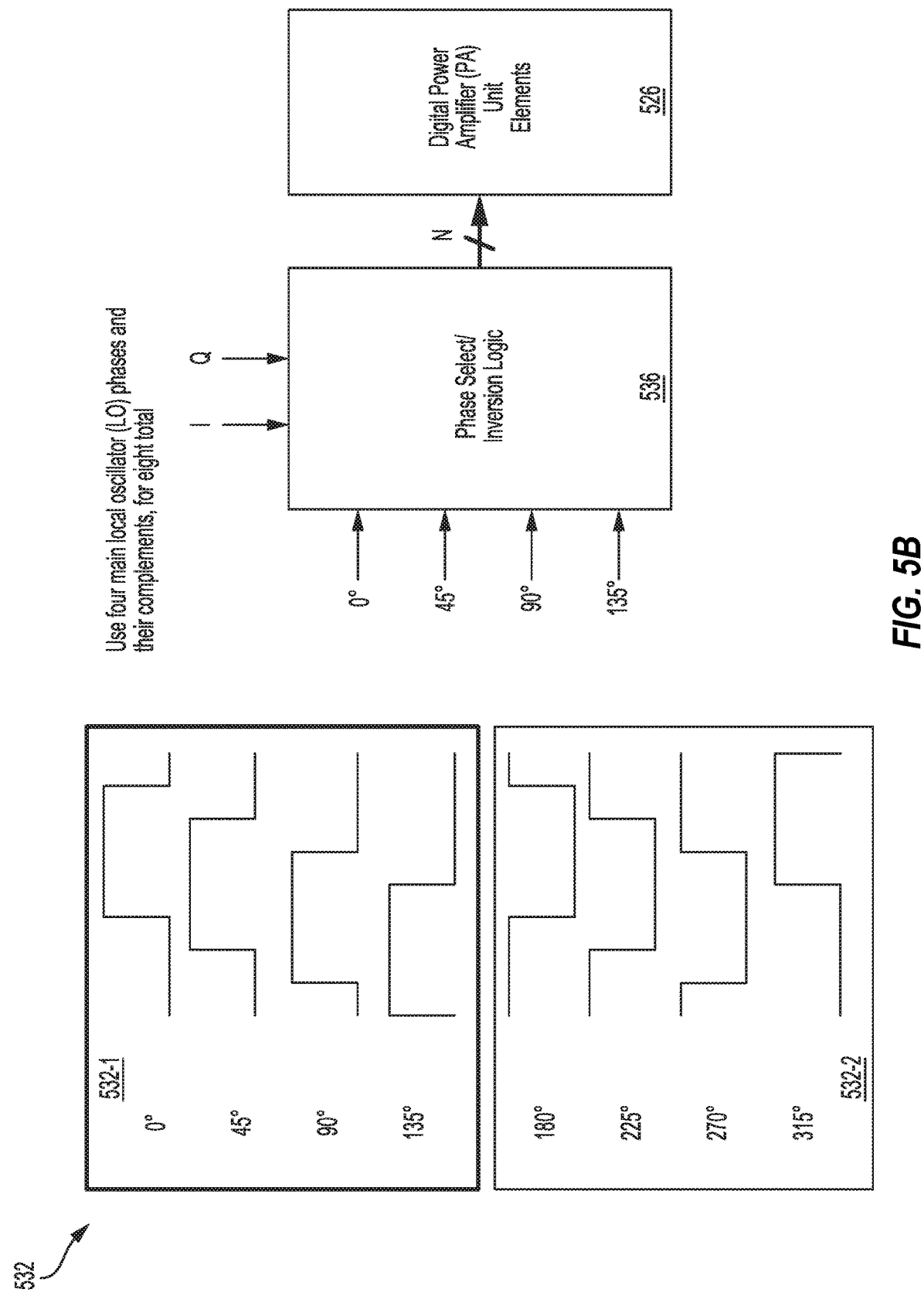
FIG. 5B is a diagram of local oscillator (LO) signals generated by an LO, according to aspects of the present disclosure.

FIG. 5B is a diagram of local oscillator (LO) signals (e.g., LO signals 532) generated by an LO, according to aspects of the present disclosure. For example, the LO 530 of FIG. 5A may generate the LO signals 532 corresponding to multiple angles (e.g., 0 degrees, 45 degrees, 90 degrees, 135 degrees, etc.), such as $LO_0$, $LO_{45}$, $LO_{90}$, $LO_{135}$, $LO_{180}$, $LO_{225}$, $LO_{270}$, and $LO_{315}$. The LO signals 532 may be phase shifted 45 degrees relative to each other. Of course, these values are exemplary only, and there may be more or less than eight phases in other configurations. Additionally, the phase of LO signals 532 may be shifted by other phases other than 45 degrees. The phases may be generated by a ring oscillator based voltage controlled oscillator (VCO) using delay elements. Alternatively, a divider with a high frequency (e.g., 10 GHz) VCO may be employed. An inductor capacitor (LC) tank single phase VCO in combination with a delay lock loop could alternatively be employed in yet another configuration.

According to additional aspects of the present disclosure, the LO 530 may be configured to generate four phases (e.g., 0 degrees, 45 degrees, 90 degrees, 135 degrees, etc.). An additional four phases may be generated by inverting these phases depending on the sign of the I and Q signals, for a total of eight phases. For example, the inversion (e.g., implemented through inverters) may take place after the first multiplexer 522 and the second multiplexer 524 and before the first gate 540 and the second gate 542 in FIG. 5A.

According to an aspect of the present disclosure, a first set of LO signals 532-1 may be input into the first multiplexer 522 of FIG. 5A, and a second set of LO signals 532-2 may be input into the second multiplexer 524 of FIG. 5A. The first set of LO signals 532-1 may be different from the second set of LO signals 532-2. The first multiplexer 522 may be configured to receive the sel_ph_Y signal.

According to an aspect of the present disclosure, a phase selector 536 may include portions of the first processor 512, the second processor 514, the first thermometer encoder 516, and the first multiplexer 522. According to additional aspects of the present disclosure, the phase selector 536 may be coupled to the unit elements 526 of the digital power amplifier 500, where N is a total number of the unit elements 526. It is understood that the second set of LO signals 532-2 may be processed a substantially similar manner. Additionally, it is understood that the second multiplexer 524 may also be configured to receive the sel_ph_X signal. In addition, the second multiplexer 524 may be coupled to N of the unit elements 526 in a substantially similar manner.

Figure 5C:
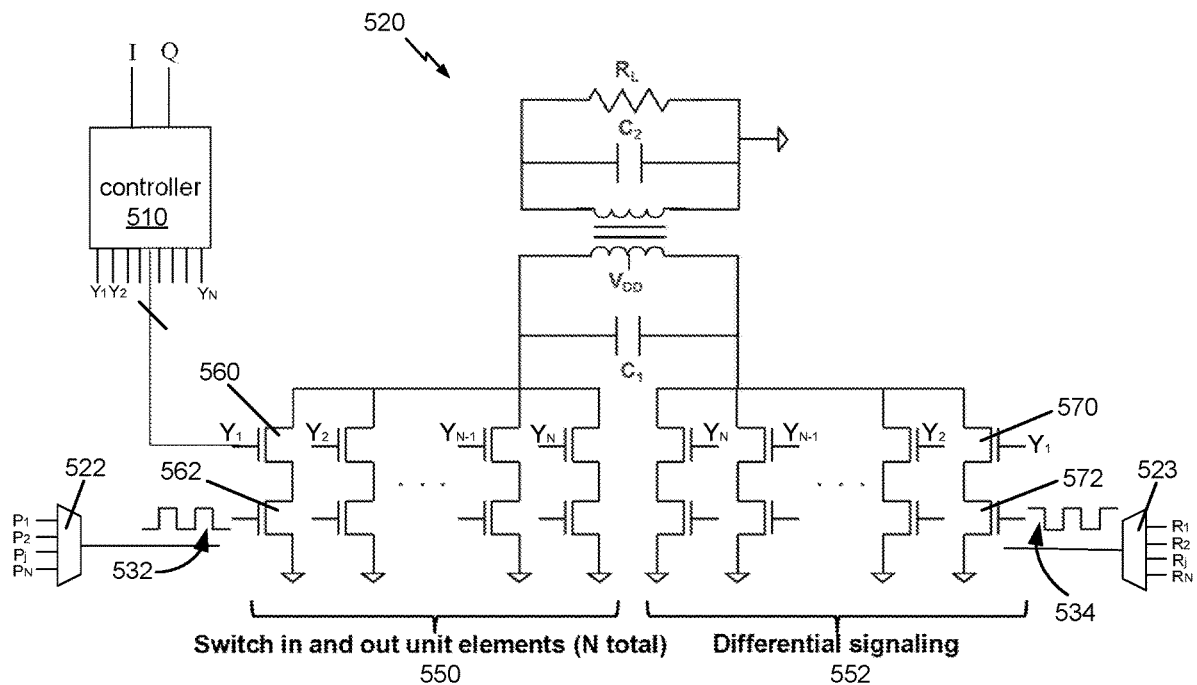
FIGS. 5C-5F illustrate various output stage configurations for a digital amplifier, according to aspects of the present disclosure.

FIG. 5C illustrates a schematic diagram of an output stage 520 for the digital power amplifier 500, according to an aspect of the present disclosure. For example, the output stage 520 may include an inverse class D power amplifier (PA).

In this configuration, the controller 510 and the LO signals 532 may be input to the output stage 520. The controller 510 may output multiple signals (e.g., $Y_1, \ldots, Y_N$), such that each top transistor receives one of the multiple signals. In this example, the LO 530 may generate the LO signals 532. For example, the LO signals 532 may be one of the first set of LO signals 532-1. The output stage 520 may be configured for single-ended or differential signaling. A first group 550 may include multiple transistors coupled in parallel. A second group 552 may also include multiple transistors coupled in parallel.

According to an aspect of the present disclosure, a first transistor 560 of each of the first group 550 (e.g., single-ended) may be coupled to the controller 510. A second transistor 562 of each of the first group 550 may be coupled to the LO 530 (e.g., LO signals 532) and the first multiplexer 522. The first multiplexer is configured to receive signals $P_1$, $P_2, \ldots, P_j$, and $P_N$. For differential signaling, a first differential transistor 570 of each of a second group 552

(e.g., differential) may be coupled to the controller 510 as well as I and Q signals, and a second differential transistor 572 of the second group 552 may be coupled to an inverse LO signal 534 and the third multiplexer 523. The first multiplexer is configured to receive signals $R_1, R_2, \ldots, R_j$, and $R_N$. The inverse LO signal 534 may include the second set of LO signals 532-2.

According to an aspect of the present disclosure, a unit element includes the first transistor 560, the second transistor 562, the first differential transistor 570, and the second differential transistor 572. In this way, the circuit operates with complementary phases whenever a unit element is active.

According to aspects of the present disclosure, the first group 550 and the second group 552 may be coupled to capacitor $C_1$ and $V_{DD}$. The signal conducted by the inductor near $V_{DD}$ may be inductively coupled to capacitor $C_2$ and resistor $R_L$, to output a transmission signal.

Figure 5D:
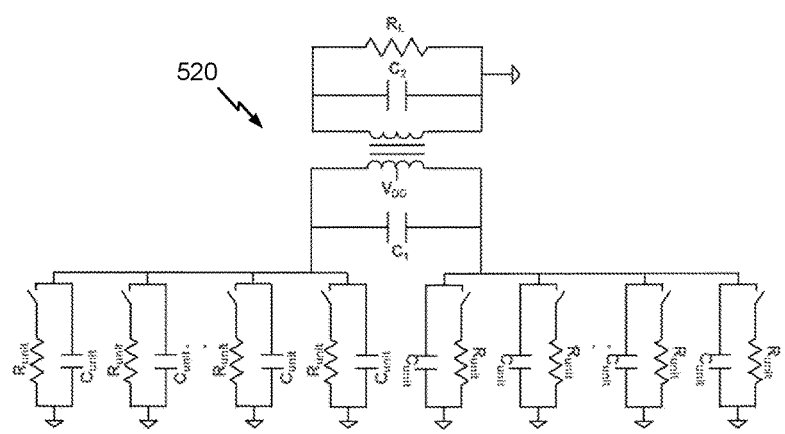

According to alternative aspects of the present disclosure, the output stage 520 may include inverse class-D, inverse class-D amplitude modulation, and/or switched capacitors. For example, the first group 550 and the second group 552 may each include resistors $R_{unit}$ and capacitors $C_{unit}$ coupled in parallel with each other, as shown in FIG. 5D. The resistors $R_{unit}$ and capacitors $C_{unit}$ may vary depending on an output voltage, and may be configured to absorb parasitics.

Figure 5E:
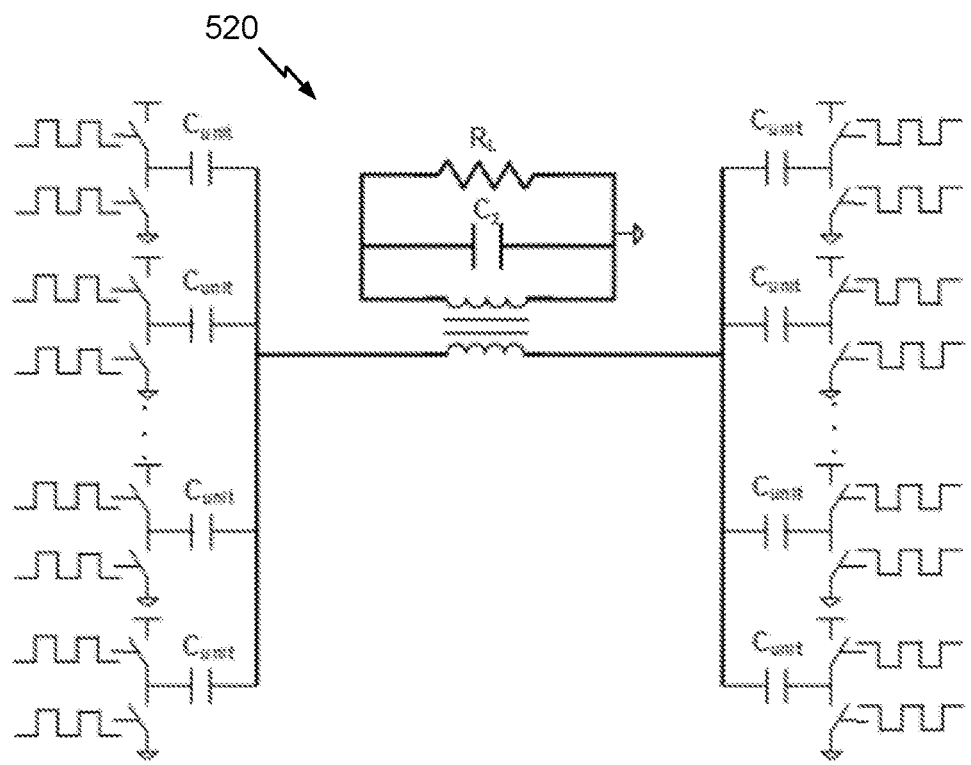

FIG. 5E illustrates another configuration of the output stage 520 using multiple switched capacitors (SWCAPs). In this configuration, energy is transferred to the load using charge transfer. Additionally, each unit element may be determined to be switched or not switched. According to an aspect of the present disclosure, the top switches are PMOS and the bottom switches are NMOS. Similar to the above in FIG. 5C, the switches on the left are configured to receive the $P_j$ signals (e.g., single-ended), and the switches on the right are configured to receive the $R_j$ signals (e.g., differential).

Figure 5F:
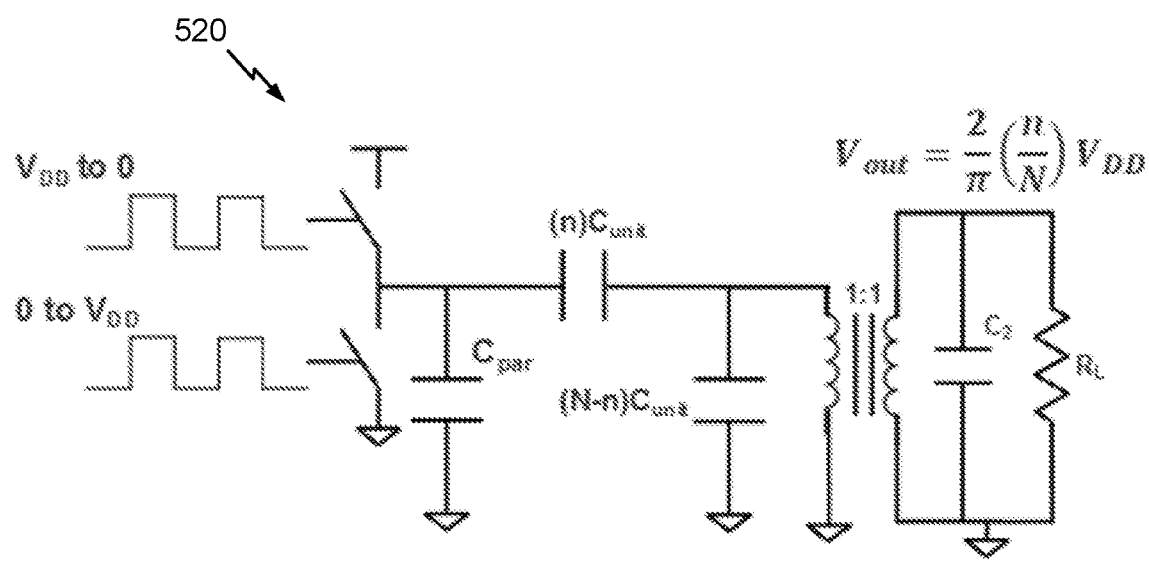

According to an aspect of the present disclosure, the output stage 520 of FIG. 5E may be implemented as illustrated by FIG. 5F. For example, the output stage 520 may utilize an equivalent circuit for the SWCAPs. In this configuration, the output voltage depends on a capacitor ratio, because the inductor sees the same capacitance. As a result, the output stage exhibits a very linear operation.

Figure 6:
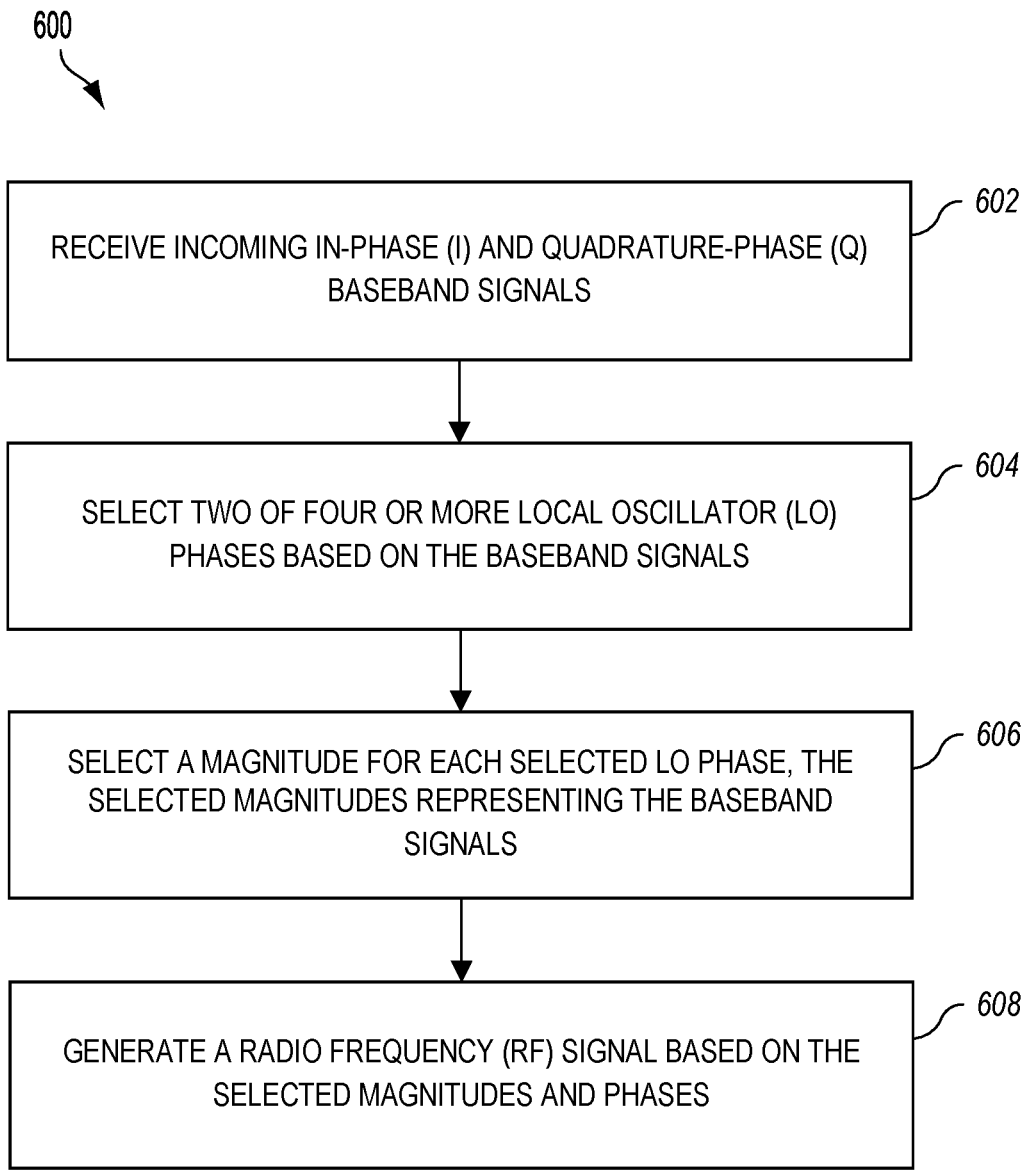
FIG. 6 depicts a simplified flowchart of a method for digital modulation, according to aspects of the present disclosure.

FIG. 6 depicts a simplified flowchart 600 of a digital modulation method, according to aspects of the present disclosure. At block 602, in-phase (I) and quadrature-phase (Q) baseband signals are received. For example, an input signal (I, Q) may be received at the controller 510, as shown in FIG. 5A.

At block 604, two of four or more local oscillator (LO) phases are selected based on the baseband signals. For example, the LO phases may be chosen based on the mapping chart 460, as shown in FIG. 4D.

At block 606, a magnitude for each selected LO phase is selected, the selected magnitudes representing the baseband signals. For example, the magnitude may be selected based on the mapping chart 460 of FIG. 4D. According to an aspect of the present disclosure, the incoming I and Q baseband signals may be projected onto a discrete number of basis vectors.

At block 608, a radio frequency (RF) signal is generated based on the selected magnitudes and phases. For example, the RF signal may be generated at the output stage 520, as shown in FIG. 5A.

Figure 7A:
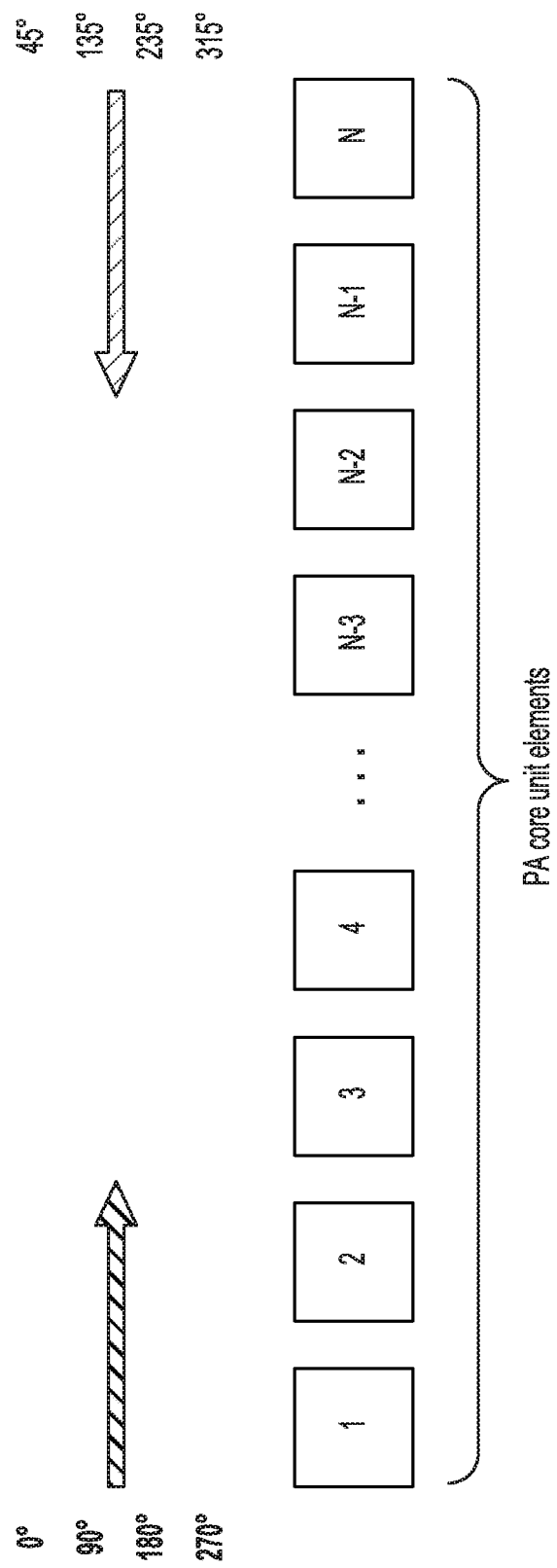
FIGS. 7A, 7B, and 7C illustrate various techniques to control core unit elements, according to aspects of the present disclosure.
Figure 7B:
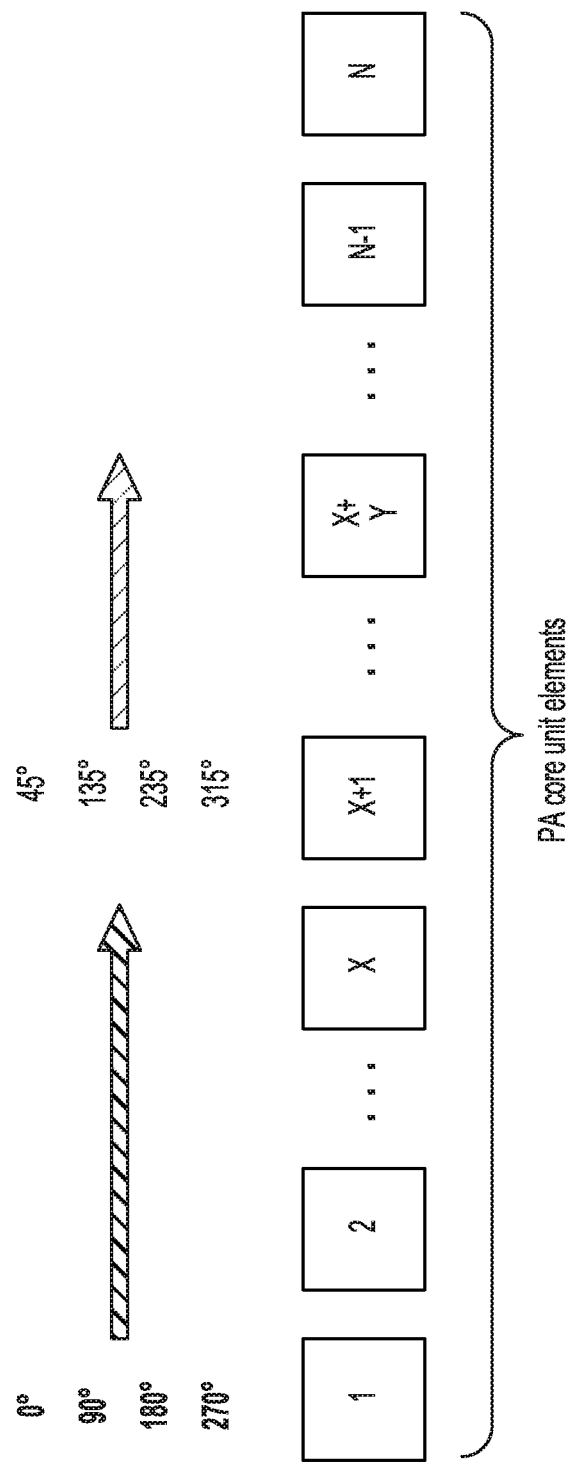
Figure 7C:
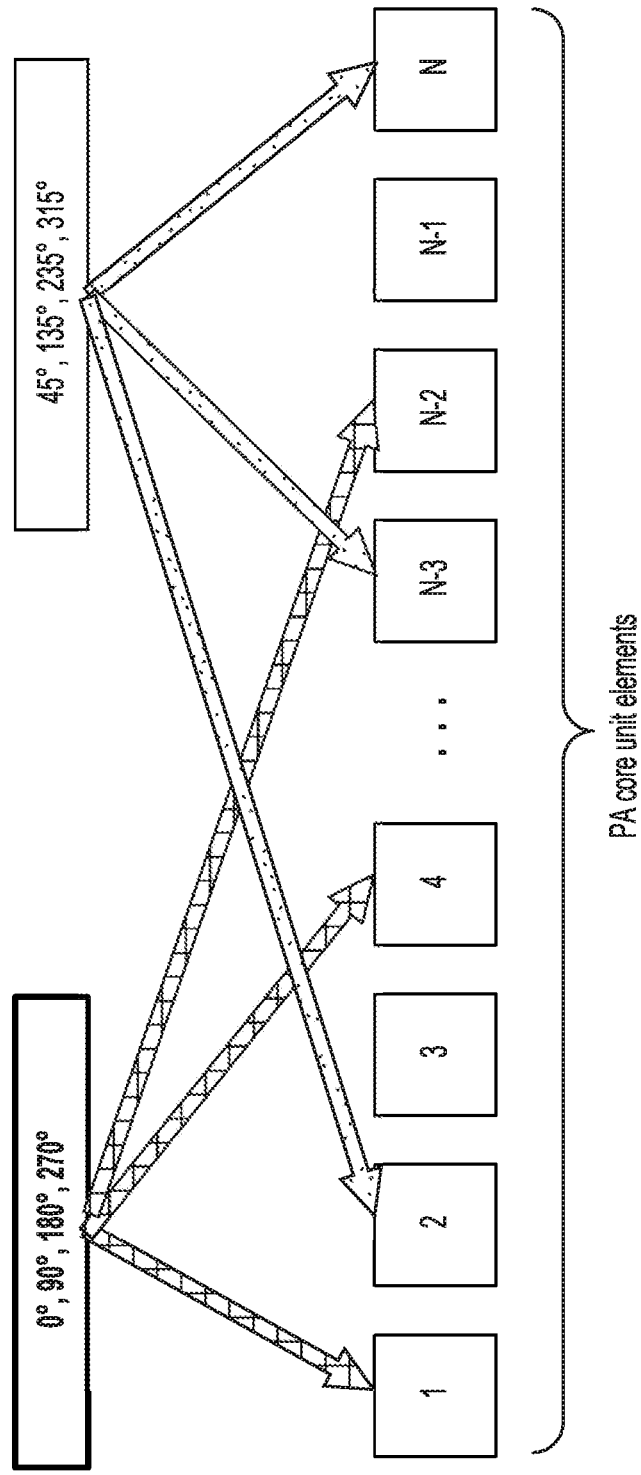

FIGS. 7A, 7B, and 7C illustrate various techniques to control the power amplifier core unit elements. Each of the numbered boxes (e.g., 1, 2, . . . , N) represents one of the power amplifier (PA) unit elements 526 (e.g., 1, 2, . . . , j, . . . , N) of FIG. 5A.

FIG. 7A illustrates an example of unit element sharing. In this configuration, only one of phases 0°, 90°, 180, or 270° (group 1 phases) is active at any one time and only one of phases 45°, 135°, 235°, or 315° (group 2 phases) is active at any time. Unit elements are activated with these phases from opposite sides of the power amplifier core unit element array. For phases 0°, 90°, 180°, and 270° first activate unit element 1, then unit elements 2, 3, 4, etc. For phases 45°, 135°, 235°, and 315° first activate unit element N, and then unit elements N-1, N-2, N-3, etc. The implementation illustrated in FIG. 7A is the simplest configuration and is easily implemented.

FIG. 7B illustrates an example of offset unit element allocation. In this configuration, only one of phases 0°, 90°, 180, or 270° is active at any one time and only one of phases 45°, 135°, 235°, or 315° is active at any time. Unit elements with the phases 45°, 135°, 235°, or 315° are activated directly after the last unit element activated with phase 0°, 90°, 180, or 270°. Phase 0°, 90°, 180, or 270° will be sent to unit elements 1 through X, where X is the corresponding phase code. Phase 45°, 135°, 235°, or 315° will be sent to unit element X+1 up to X+Y. The implementation illustrated in FIG. 7B has improved matching because the unit elements are closer together. Another advantage is improved heat dissipation.

FIG. 7C illustrates an example of dynamic element matching. Only one of phases 0°, 90°, 180, or 270° is active at any one time and only one of phases 45°, 135°, 235°, or 315° is active at any time. There are multiple possible choices for which unit elements are activated (or left inactive) for each code. This will convert the mismatch between unit elements into additional white noise, and improve linearity. An advantage of this layout is dynamic element matching for improved results.

According to an aspect of the present disclosure, a modulator (e.g., a digital power amplifier) is described. In one configuration, the digital power amplifier includes means for receiving. The receiving means may be the controller 510 shown in FIG. 5A. In one configuration, the digital power amplifier includes means for selecting. The selecting means may be the controller 510 shown in FIG. 5A. In one configuration, the digital power amplifier includes means for outputting. The outputting means may be the controller 510 shown in FIG. 5A. In one configuration, the digital power amplifier includes means for clipping. The clipping means may be the controller 510 shown in FIG. 5A. In another aspect, the aforementioned means may be any module or any apparatus or material configured to perform the functions recited by the aforementioned means.

Figure 8:
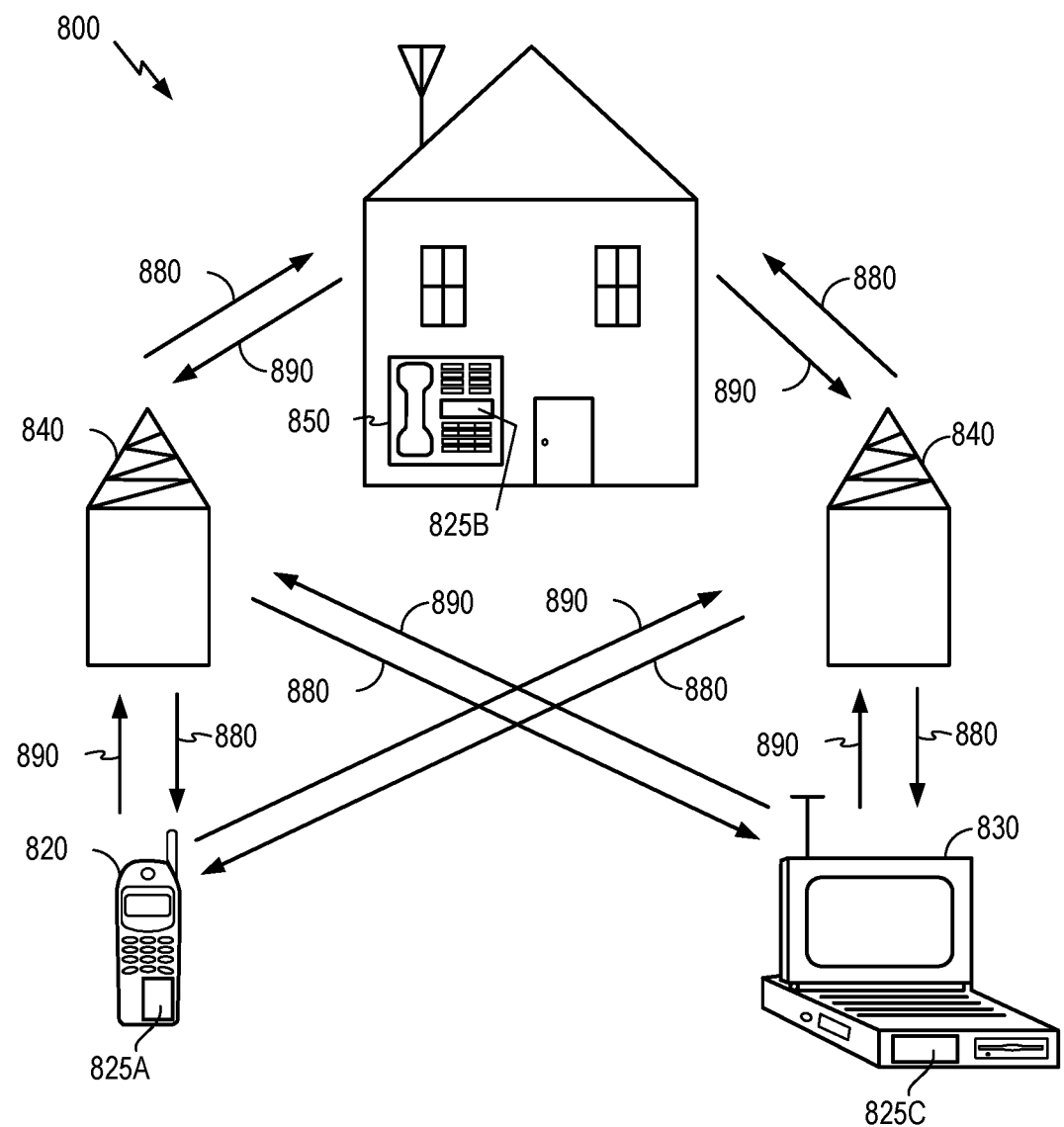
FIG. 8 is a block diagram showing an exemplary wireless communication system in which a configuration of the disclosure may be advantageously employed.

FIG. 8 is a block diagram showing an exemplary wireless communication system in which a configuration of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825B, and 825C that include the disclosed modulator (e.g., digital power amplifier). It will be recognized that other devices may also include the disclosed digital power amplifier, such as the base stations, switching devices, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the digital power amplifier.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device.

Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A modulator, comprising:
   a controller configured to receive in-phase (I) baseband signals and quadrature-phase (Q) baseband signals, the controller configured to select a section of a region defined by a number of local oscillator (LO) phases, the controller configured to output a plurality of control signals and a pair of phase selection signals; and
   a plurality of output stages, each of the plurality of output stages coupled to the controller to receive a pair of the plurality of control signals, the pair of phase selection signals, and a plurality of offset LO signals, each of the plurality of output stages comprising a unit element.

2. The modulator of claim 1, in which the number of LO phases is at least eight.

3. The modulator of claim 2, in which the controller is further configured to clip the received I and Q baseband signals to fit within the section.

4. The modulator of claim 1, in which the plurality of control signals are thermometer-encoded.

5. The modulator of claim 1, further comprising a phase generator configured to generate the LO phases and coupled to the plurality of output stages.

6. The modulator of claim 1, in which a total quantity of the plurality of control signals is less than or equal to a quantity of unit elements.

7. The modulator of claim 1, in which the controller comprises a first processor coupled to a second processor, the first processor configured to receive the I and Q baseband signals, and the second processor is configured to receive an output of the first processor and is configured to output the plurality of control signals.

8. The modulator of claim 1, in which each of the plurality of output stages comprises a plurality of multiplexers coupled to the unit element of each output stage, each multiplexer configured to select one of the LO phases using one of the phase selection signals, the plurality of multiplexers shared by the plurality of output stages.

9. The modulator of claim 1, in which the plurality of output stages comprise inverse class-D amplifiers, inverse class-D amplitude modulation amplifiers, and/or switched capacitors.

10. The modulator of claim 1, in which the controller is configured to determine the plurality of control signals and the pair of phase selection signals using a mapping table.

11. A digital modulation method, comprising:
    receiving incoming in-phase (I) and quadrature-phase (Q) baseband signals;
    selecting two of eight or more local oscillator (LO) phases based at least in part on a section of a region corresponding to the baseband signals;
    selecting a magnitude for each selected local oscillator phase based on the section, the selected magnitudes representing the baseband signals; and
    generating a radio frequency (RF) signal based at least in part on the selected magnitudes and phases.

12. The method of claim 11, in which the selecting comprises projecting the incoming I and Q baseband signals onto two basis vectors.

13. The method of claim 11, further comprising clipping the incoming I and Q baseband signals.

14. The method of claim 11, in which the selecting is based at least in part on a mapping table.

15. A modulator, comprising:
    means for receiving in-phase (I) baseband signals and quadrature-phase (Q) baseband signals;
    means for selecting a section of a region defined by a number of local oscillator (LO) phases;
    means for outputting a plurality of control signals and a pair of phase selection signals; and
    a plurality of output stages, each of the plurality of output stages coupled to the outputting means to receive a pair of the plurality of control signals, the pair of phase selection signals, and a plurality of offset LO signals, each of the plurality of output stages comprising a unit element.

16. The modulator of claim 15, in which the number of LO phases is at least eight.

17. The modulator of claim 15, further comprising means for clipping the received I and Q baseband signals to fit within the section.

18. The modulator of claim 15, in which the plurality of control signals are thermometer-encoded.

19. The modulator of claim 15, further comprising a phase generator coupled to the plurality of output stages.

20. The modulator of claim 15, in which a total number of the plurality of control signals is less than or equal to a number of unit elements.

21. The modulator of claim 1, in which the plurality of control signals and the pair of phase selection signals are based on the selected section of the region.

* * * * *